(12) United States Patent
Yamada et al.

(10) Patent No.: US 7,597,602 B2
(45) Date of Patent: Oct. 6, 2009

(54) ORGANIC LIGHT EMITTING DEVICE, MANUFACTURING METHOD THEREOF, AND DISPLAY UNIT

(75) Inventors: Hirokazu Yamada, Kanagawa (JP); Takashi Hirano, Kanagawa (JP); Kohji Hanawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 358 days.

(21) Appl. No.: 11/551,001

(22) Filed: Oct. 19, 2006

(65) Prior Publication Data

US 2007/0066178 A1   Mar. 22, 2007

Related U.S. Application Data

(62) Division of application No. 10/941,682, filed on Sep. 15, 2004, now Pat. No. 7,173,373.

(30) Foreign Application Priority Data

Sep. 19, 2003   (JP)   ............................ P2003-328979

(51) Int. Cl.
*H05B 33/04* (2006.01)
*H05B 33/10* (2006.01)
*H01J 9/00* (2006.01)
(52) U.S. Cl. ............................ 445/24; 445/25; 313/506
(58) Field of Classification Search ............ 445/24–25; 313/504–506; 428/690
See application file for complete search history.

(56) References Cited

U.S. PATENT DOCUMENTS

2002/0011783 A1 *  1/2002  Hosokawa .................. 313/504

2003/0048072 A1   3/2003  Ishihara et al.

FOREIGN PATENT DOCUMENTS

| EP | 1096568 | 5/2001 |
|---|---|---|
| EP | 1331666 | 7/2003 |
| JP | 05-275172 | 10/1993 |
| JP | 10-003990 | 1/1998 |
| JP | 11-214161 | 8/1999 |
| JP | 2001-085163 | 3/2001 |
| JP | 2001-176660 | 6/2001 |
| JP | 2001-230086 | 8/2001 |
| JP | 2002-033191 | 1/2002 |
| JP | 2002-318556 | 10/2002 |
| JP | 2002-352963 | 12/2002 |

OTHER PUBLICATIONS

Japanese Office Action Issued on May 31, 2007.

* cited by examiner

*Primary Examiner*—Nimeshkumar D. Patel
*Assistant Examiner*—Anne M Hines
(74) *Attorney, Agent, or Firm*—Sonnenschein Nath & Rosenthal LLP

(57) ABSTRACT

The invention provides an organic light emitting device which can electrically connect an auxiliary wiring and a second electrode without using a mask for pixel coating, a manufacturing method thereof, and a display unit. In organic light emitting devices, for example, a first electrode as an anode, an insulating film, an organic layer including a light emitting layer, and a second electrode as a cathode are layered in this order from a substrate side. The organic layer has a break part on a side face of an auxiliary wiring. The auxiliary wiring and the second electrode are electrically connected through this break part.

10 Claims, 15 Drawing Sheets

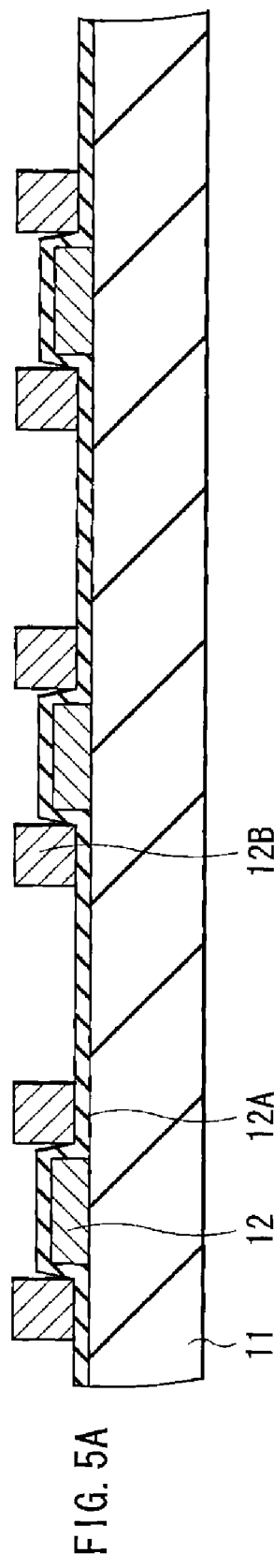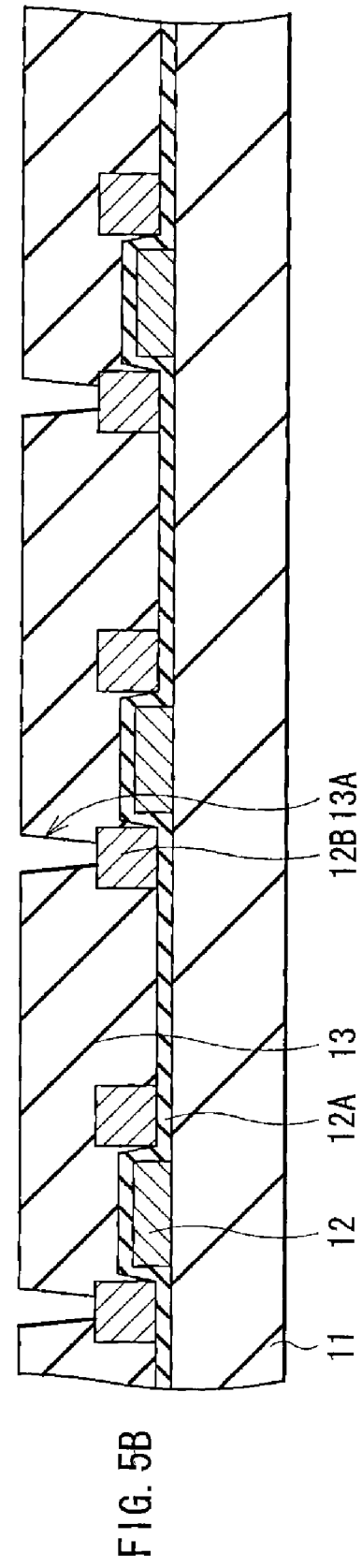

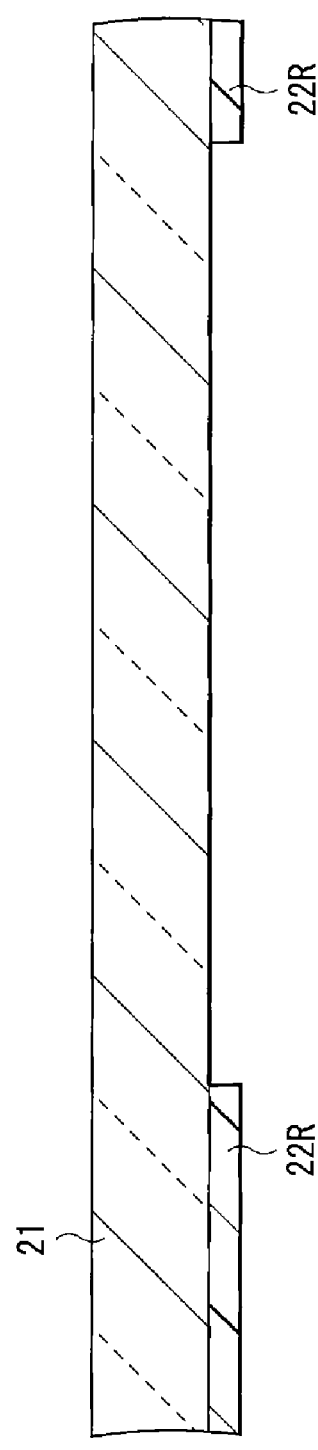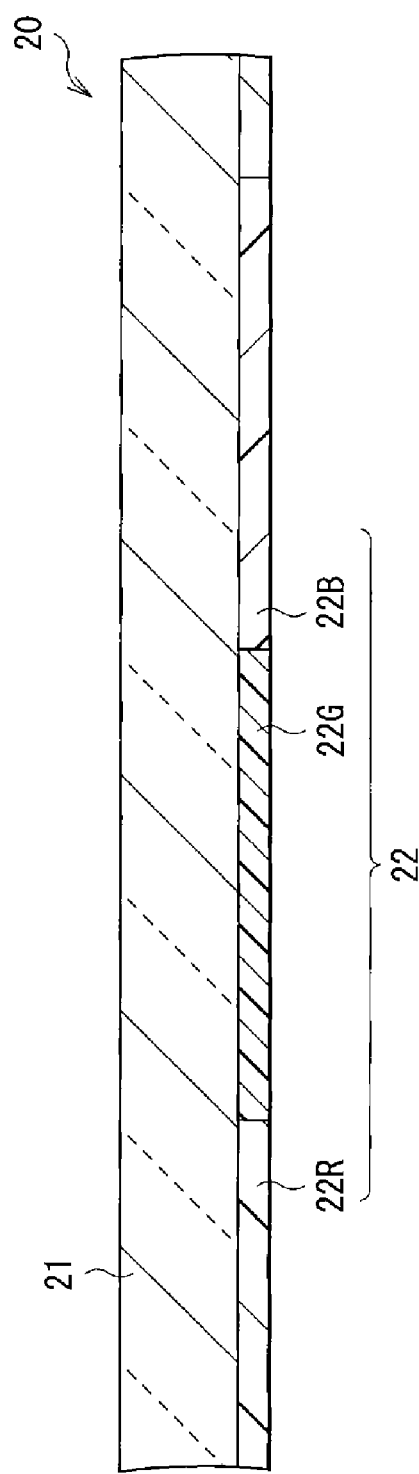

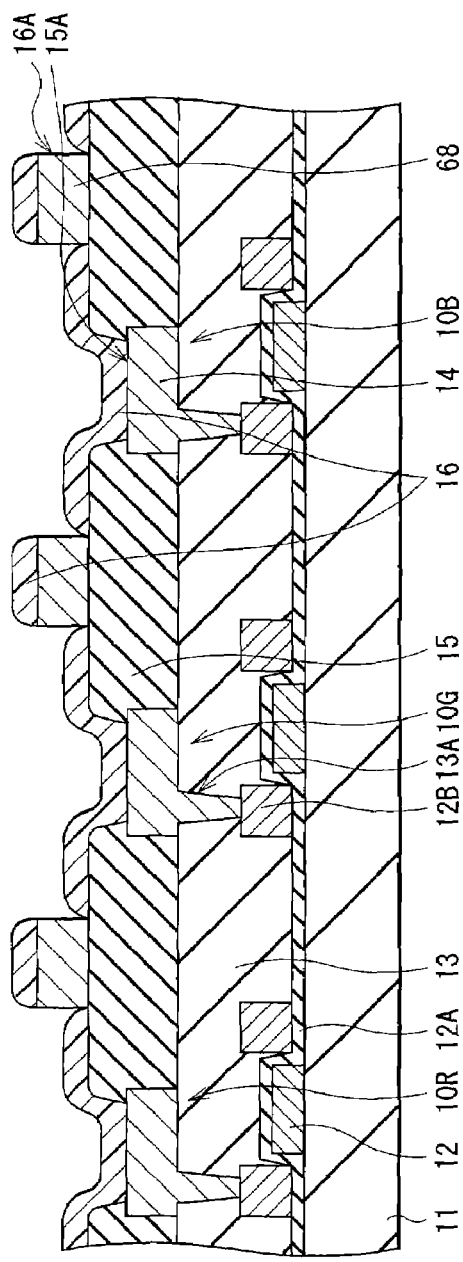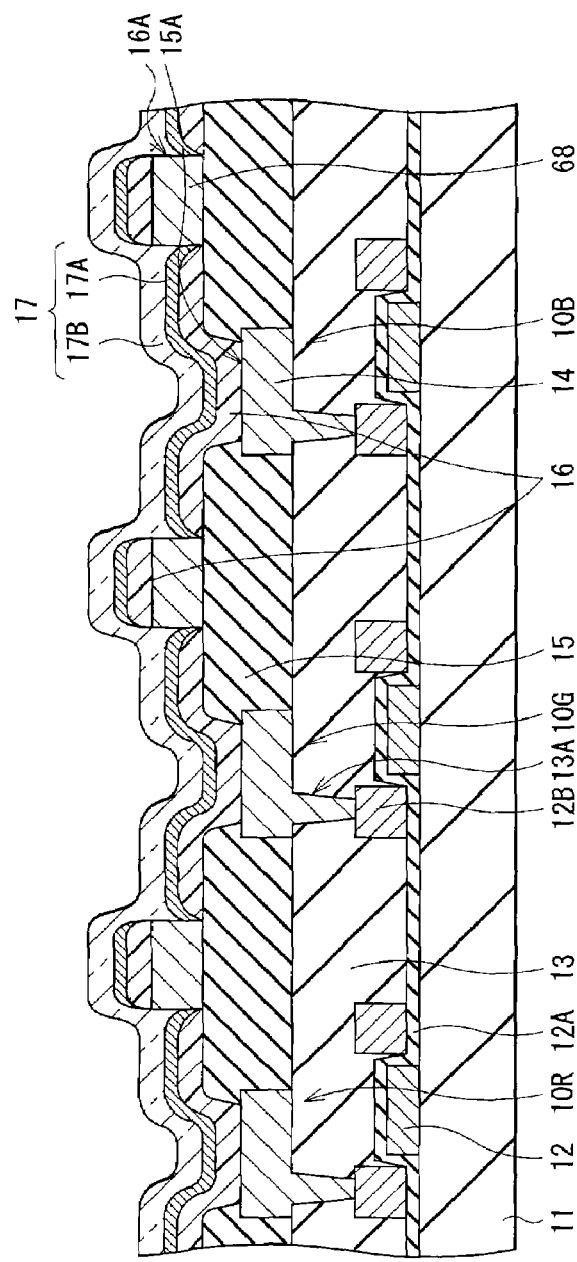
FIG. 15A
FIG. 15B

ORGANIC LIGHT EMITTING DEVICE, MANUFACTURING METHOD THEREOF, AND DISPLAY UNIT

RELATED APPLICATION DATA

This application is a divisional of U.S. patent application Ser. No. 10/941,682, filed Sep. 15, 2004, now U.S. Pat. No. 7,173,373 the entirety of which is incorporated herein by reference to the extent permitted by law. The present application claims priority to Japanese patent application No. 2003-328979 filed in the Japanese Patent Office on Sep. 19, 2003, the entirety of which also is incorporated by reference herein to the extent permitted by law.

BACKGROUND OF THE INVENTION

1. Field of the Invention

The present invention relates to an organic light emitting device comprising an auxiliary wiring between pixels, a manufacturing method thereof, and a display unit using it.

2. Description of the Related Art

In these years, as one of flat panel displays, an organic light emitting display which uses organic light emitting devices has been noted. The organic light emitting display has characteristics that its visual field angle is wide and its power consumption is low since it is a self-luminous type display. The organic light emitting display is also thought of as a display having sufficient response to high-definition high-speed video signals, and is under development toward the practical use.

As an organic light emitting device, for example, as shown in FIG. 1, an organic light emitting device, wherein a first electrode 111, an organic layer 112 including a light emitting layer, and a second electrode 113 are sequentially layered on a substrate 110 is known. In some cases, the second electrode 113 is electrically connected to an auxiliary wiring 113A having a low resistance, in order to prevent variation of luminance in a screen by inhibiting voltage drop (for example, refer to Japanese Unexamined Patent Application Publication No. 2001-195008).

Regarding materials for the organic layer 112, there are two kinds of the organic layer 112: one is made of a low molecular material; and the other is made of a high molecular material. As a method of forming the organic layer 112 made of the low molecular material, vacuum deposition method is generally used. When the organic layer 112 is formed by the vacuum deposition method, as shown in FIG. 2, the auxiliary wiring 113A is prevented from being covered with the organic layer 112 by using a mask for pixel coating 120 having apertures 121 corresponding to a position where the organic layer 112 is to be formed. After that, the second electrode 113 is formed on almost a whole surface of the substrate 110, and thereby, the auxiliary wiring 113A and the second electrode 113 are electrically connected.

However, when a high-definition organic light emitting display is fabricated, it is hard to form the organic layer 112 precisely due to influence of thermal expansion of the mask for pixel coating 120. Further, when particles adhering to the mask for pixel coating 120 adheres to the organic layer 112 and the like, short circuit may arise. Therefore, it is desirable to form the organic layer 112 without using the mask for pixel coating 120. In this case, however, the organic layer 112 is formed on almost a whole surface of the substrate 110. This leads to a problem that the auxiliary wiring 113A and the second electrode 113 cannot be electrically connected.

SUMMARY OF THE INVENTION

In light of the foregoing, it is an object of the invention to provide an organic light emitting device in which an auxiliary wiring and a second electrode can be electrically connected without using a mask for pixel coating, a manufacturing method thereof, and a display unit.

The organic light emitting device according to the invention is an organic light emitting device comprising: a first electrode formed on a substrate; an auxiliary wiring formed on the substrate, which is insulated from the first electrode; an organic layer which includes a light emitting layer, which covers at least the first electrode and the auxiliary wiring on the substrate, and which has a break part on a side face of the auxiliary wiring; and a second electrode which covers the organic layer, and which is electrically connected to the auxiliary wiring at the break part of the organic layer. Here, the "side face" of the auxiliary wiring means a face crossing a face which contacts the substrate of the auxiliary wiring.

The method of manufacturing an organic light emitting device according to the invention comprises the steps of forming a first electrode and an auxiliary wiring insulated from the first electrode on a substrate; forming an organic layer including a light emitting layer on at least the first electrode and the auxiliary wiring, and forming a break part by breaking the organic layer by a step of a side face of the auxiliary wiring; and forming a second electrode on the organic layer, and electrically connecting the second electrode and the auxiliary wiring at the break part of the organic layer.

The display unit according to the invention is a display unit having a plurality of organic light emitting devices on a substrate, wherein the organic light emitting device is provided with a first electrode formed on the substrate; an auxiliary wiring formed on the substrate, which is insulated from the first electrode; an organic layer which includes a light emitting layer, covers at least the first electrode and the auxiliary wiring on the substrate, and has a break part on a side face of the auxiliary wiring; and a second electrode which covers the organic layer and is electrically connected to the auxiliary wiring at the break part of the organic layer.

In the organic light emitting device according to the invention and the display unit according to the invention, the organic layer has the break part on the side face of the auxiliary wiring. The auxiliary wiring and the second electrode are electrically connected through this break part. Therefore, a sheet resistance of the second electrode is lowered, and voltage drop in the second electrode is inhibited. Consequently, variation of luminance between a peripheral part and a central part of the display screen can be inhibited.

In the method of manufacturing an organic light emitting device according to the invention, the first electrode and the auxiliary wiring insulated from the first electrode are formed on the substrate. Subsequently, the organic layer including the light emitting layer is formed on at least the first electrode and the auxiliary wiring, and the break part is formed by breaking the organic layer by the step of the side face of the auxiliary wiring. After that, the second electrode is formed on the organic layer, and the second electrode and the auxiliary wiring are electrically connected at the break part of the organic layer.

According to the organic light emitting device of the invention and the display unit of the invention, the organic layer has the break part at the side face of the auxiliary wiring, and the auxiliary wiring and the second electrode are electrically connected through this break part. Therefore, voltage drop in the second electrode is inhibited by the auxiliary wiring, and variation of luminance in the screen can be inhibited. Consequently, a display quality can be improved.

According to the method of manufacturing an organic light emitting device of the invention, after the break part is formed by breaking the organic layer by the step of the side face of the auxiliary wiring, the second electrode and the auxiliary wiring are electrically connected through this break part. Therefore, even when the organic layer is formed without using a mask for pixel coating, the auxiliary wiring and the second electrode can be electrically connected. Consequently, deposition failure such as lack of the organic layer due to displacement or influence of thermal expansion of the mask for pixel coating can be prevented to improve process yield, which is significantly advantageous for making a high-definition display. Further, it is possible to prevent dust and the like adhering to the mask for pixel coating from adhering to the organic layer and the like, which leads to a cause of short circuit. Furthermore, no extra process is needed to electrically connect the second electrode and the auxiliary wiring. Therefore, the number of processes can be less.

Other and further objects, features and advantages of the invention will appear more fully from the following description.

BRIEF DESCRIPTION OF THE DRAWINGS

FIGS. 5A and 5B are cross sectional views showing a method of manufacturing the display unit shown in FIG. 3 in order of processes;

FIGS. 11A and 11B are cross sectional views showing processes following FIG. 10;

FIGS. 15A and 15B are cross sectional views showing processes following FIGS. 14A and 14B;

DETAILED DESCRIPTION OF THE PREFERRED EMBODIMENTS

Embodiments of the invention will be hereinafter described in detail with reference to the drawings.

First Embodiment

Figure 1:
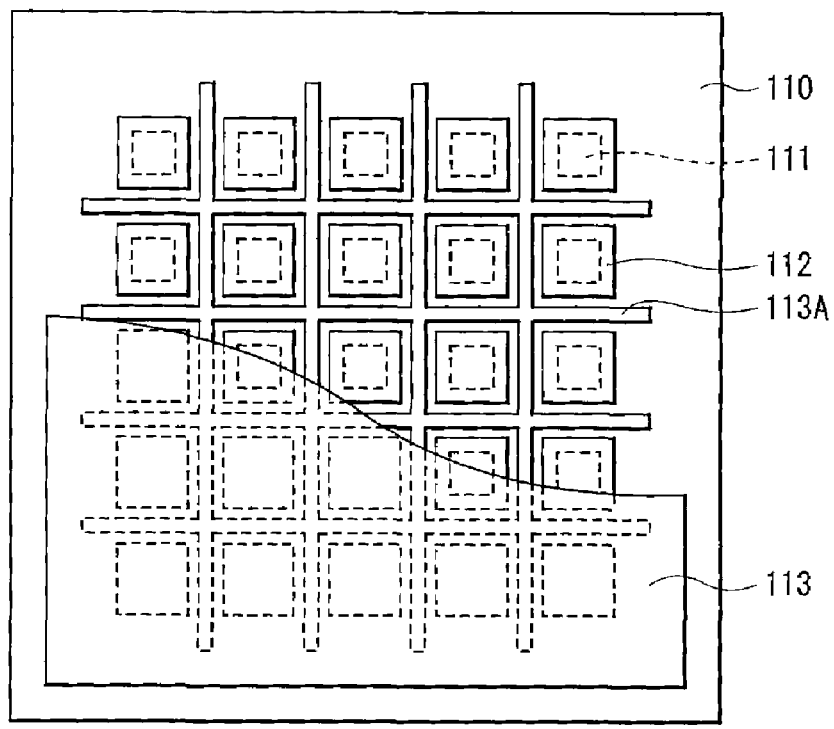
FIG. 1 is a plane view showing a construction of a conventional display unit.
Figure 2:
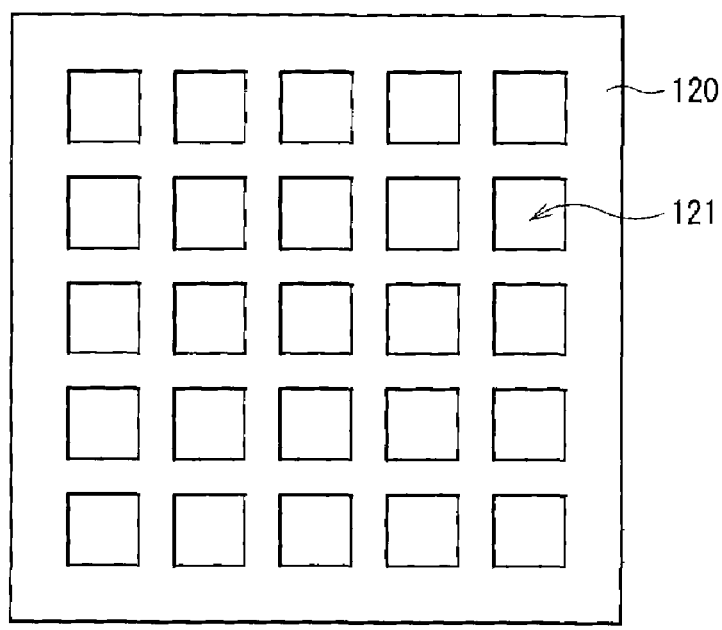
FIG. 2 is a plane view showing a conventional mask for pixel coating.
Figure 3:
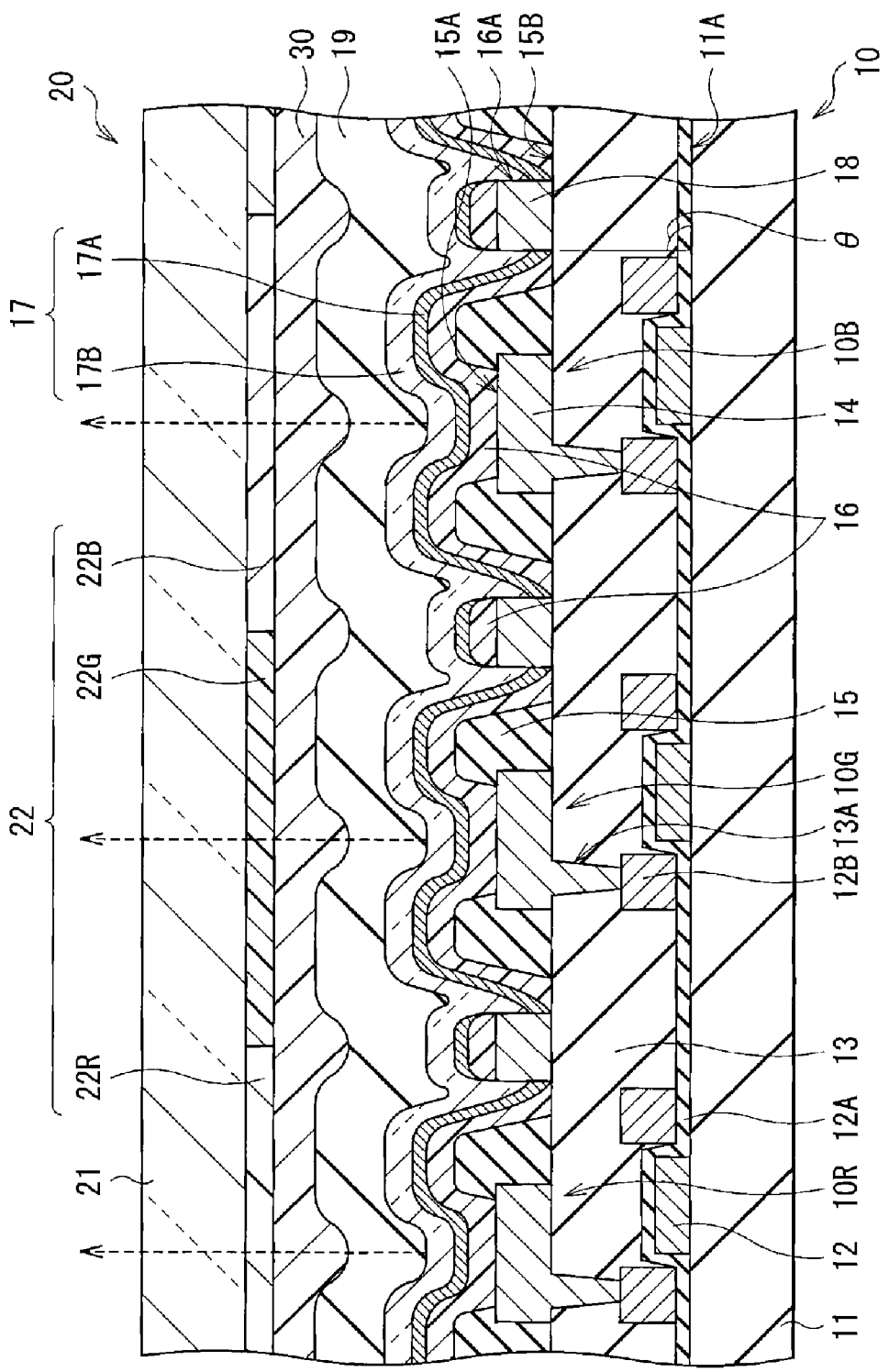
FIG. 3 is a cross sectional view showing a construction of a display unit according to a first embodiment of the invention.

FIG. 3 shows a cross sectional structure of a display unit according to a first embodiment of the invention. This display unit is used as an ultrathin organic light emitting display, wherein a driving panel 10 and a sealing panel 20 are placed opposite, and their whole surfaces are bonded together by an adhesive layer 30 made of, for example, a thermosetting resin. The driving panel 10 is, for example, sequentially provided with an organic light emitting device 10R generating red light, an organic light emitting device 10G generating green light, and an organic light emitting device 10B generating blue light in the shape of a matrix as a whole on a substrate 11 made of an insulating material such as glass with a TFT 12 and a planarizing layer 13 in between.

The TFT 12 is an active device corresponding to the respective organic light emitting devices 10R, 10G, and 10B. The organic light emitting devices 10R, 10G, and 10B are driven by active matrix method. A gate electrode of the TFT 12 (not shown) is connected to an unshown scanning circuit. A source and a drain (not shown either) are connected to a wiring 12B provided through an interlayer insulating film 12A made of silicon oxide, PSG (Phospho-Silicate Glass) or the like. The wiring 12B is connected to the source and the drain of the TFT 12 through an unshown connecting hole provided at the interlayer insulating film 12A, and is used as a signal line. The wiring 12B is made of, for example, aluminum (Al) or an aluminum (Al)-copper (Cu) alloy. A construction of the TFT 12 is not particularly limited, and can be, for example, bottom gate type or top gate type.

The planarizing layer 13 is intended to planarize a surface of the substrate 11 on which the TFT 12 is formed, and form each layer having a uniform film thickness of the organic light emitting devices 10R, 10G, and 10B. The planarizing layer 13 is provided with a connecting hole 13A to connect a first electrode 14 of the organic light emitting devices 10R, 10G, and 10B and the wiring 12B. The planarizing layer 13 is preferably made of a material having a good pattern precision since the fine connecting hole 13A is formed in the planarizing layer 13. As a material for the planarizing layer 13, an organic material such as polyimide or an inorganic material such as silicon oxide ($SiO_2$) can be used.

In the organic light emitting devices 10R, 10G, and 10B, for example, the first electrode 14 as an anode, an insulating film 15, an organic layer 16 including a light emitting layer, and a second electrode 17 as a cathode are layered in this order from the substrate 11 side with the TFT 12 and the planarizing layer 13 in between. An auxiliary wiring 18 which is electrically insulated from the first electrode 14 is formed on the substrate 11. A side face of this auxiliary wiring 18 and the second electrode 17 are electrically connected. A protective film 19 is formed on the second electrode 17 as necessary.

The first electrode 14 also has a function as a reflective layer. It is desirable that the first electrode 14 has reflectance as high as possible in order to improve light emitting efficiency. For example, as a material to make the first electrode 14, a simple substance or an alloy of metal elements such as platinum (Pt), gold (Au), silver (Ag), chromium (Cr), and tungsten (W) can be cited. It is preferable that a thickness of the first electrode 14 in the lamination direction (hereinafter simply referred to as thickness) is set to 100 nm to 300 nm.

The first electrode 14 can have a monolayer structure or a laminated structure of a plurality of layers.

The insulating film 15 is intended to secure insulation between the first electrode 14 and the second electrode 17, and to accurately make a desired form of light emitting regions in the organic light emitting devices 10R, 10G, and 10B. The insulating film 15 has, for example, a film thickness of about 600 nm, and is made of an insulating material such as silicon oxide and polyimide. The insulating film 15 is provided with an aperture 15A corresponding to the light emitting regions in the organic light emitting devices 10R, 10G, and 10B, and an aperture 15B corresponding to the auxiliary wiring 18.

The organic layer 16 is formed on the first electrode 14, the insulating film 15, and the auxiliary wiring 18. The organic layer 16 has a break part 16A broken at the side face of the auxiliary wiring 18. The auxiliary wiring 18 and the second electrode 17 are electrically connected through this break part 16A. A construction and a material of the organic layer 16 will be described later.

The second electrode 17 has a structure wherein a semi-transparent electrode 17A having semi-transparency to light generated in a light emitting layer, and a transparent electrode 17B having semi-transparency to light generated in the light emitting layer are layered in this order from the organic layer 16 side. The semi-transparent electrode 17A has, for example, a thickness of about 10 nm, and is made of metal or an alloy of silver (Ag), aluminum (Al), magnesium (Mg), calcium (Ca), sodium (Na) and the like. In this embodiment, the semi-transparent electrode 17A is, for example, made of an alloy of magnesium (Mg) and silver (MgAg alloy).

The transparent electrode 17B is intended to lower an electric resistance of the semi-transparent electrode 17A, and reduce a contact resistance between the second electrode 17 and the auxiliary wiring 18 by increasing a contact area between the second electrode 17 and the auxiliary wiring 18. The transparent electrode 17B is made of a conductive material having semi-transparency sufficient for the light generated in the light emitting layer. Regarding a material making the transparent electrode 17B, for example, the transparent electrode 17B is preferably made of at least one of indium oxides ($InO_x$), tin oxides ($SnO_x$), and zinc oxides ($ZnO_x$). Specifically, for example, the transparent electrode 17B is preferably made of a compound (IZO) containing indium, zinc (Zn), and oxygen, since good conductivity and high transmittance can be obtained even when deposition is made under room temperatures. A thickness of the transparent electrode 17B is preferably, for example, about 200 nm.

The auxiliary wiring 18 is intended to inhibit voltage drop in the second electrode 17. The auxiliary wiring 18 is formed, for example, at the aperture 15B of the insulating film 15, and is made of the same material as of the first electrode 14. Since the auxiliary wiring 18 is made of the same material as of the first electrode 14, the auxiliary wiring 18 and the first electrode 14 can be formed in the same process in a manufacturing process described later. It is not always necessary that a material and a construction of the auxiliary wiring 18 are the same as of the first electrode 14.

A thickness of the auxiliary wiring 18 is preferably larger than a thickness of the organic layer 16. The reason thereof is that the break part 16A can be formed by breaking the organic layer 16 by a step of the side face of the auxiliary wiring 18 when the organic layer 16 is deposited in the manufacturing process described later. In the case that the auxiliary wiring 18 or the organic layer 16 has a laminated structure of a plurality of layers, the thickness of the auxiliary wiring 18 or the thickness of the organic layer 16 means a total thickness of the plurality of layers.

The side face of the auxiliary wiring 18 is preferably perpendicular, or reversely tapered to the substrate 11. The reason thereof is that such a shape prevents the side face of the auxiliary wiring 18 from being covered with the organic layer 16, and makes it easy for the break part 16A to be formed in the after-mentioned manufacturing process. A taper angle θ of the side face of the auxiliary wiring 18 to a flat face 11A of the substrate 11 is preferably, for example, about from 90° to 120°. If the taper angle θ is too large, it may be hard to contact the second electrode 17 to the side face of the auxiliary wiring 18.

The protective film 19 has, for example, a thickness of 500 nm to 10,000 nm, and is a passivation film made of a transparent dielectric. The protective film 19 is, for example, made of silicon oxide ($SiO_2$), silicon nitride (SiN) and the like.

The sealing panel 20 is located on the second electrode 17 side of the driving panel 10, and has a sealing substrate 21 to seal the organic light emitting devices 10R, 10G, and 10B together with the adhesive layer 30. The sealing substrate 21 is made of a material such as glass which is transparent to the light generated in the organic light emitting devices 10R, 10G, and 10B. The sealing substrate 21 is provided with, for example, the color filter 22, which extracts the light generated in the organic light emitting devices 10R, 10G, and 10B, absorbs outside light reflected in the organic light emitting devices 10R, 10G, and 10B and the wiring therebetween, and improves contrast.

The color filter 22 can be provided on either side of the sealing substrate 21. However, it is preferable to provide the color filter 22 on the driving panel 10 side, since the color filter 22 is not exposed on the surface, and can be protected by the adhesive layer 30. The color filter 22 has a red filter 22R, a green filter 22G, and a blue filter 22B, which are orderly arranged correspondingly to the organic light emitting devices 10R, 10G, and 10B.

The red filter 22R, the green filter 22G, and the blue filter 22B are respectively, for example, formed in the shape of a rectangle with no clearance in between. The red filter 22R, the green filter 22G, and the blue filter 22B are respectively made of a resin mixed with a pigment and are adjusted so that light transmittance in the targeted red, green, or blue wavelength band becomes high and light transmittance in other wavelength bands becomes low by selecting a pigment.

Figures 4A, 4B, 4C:
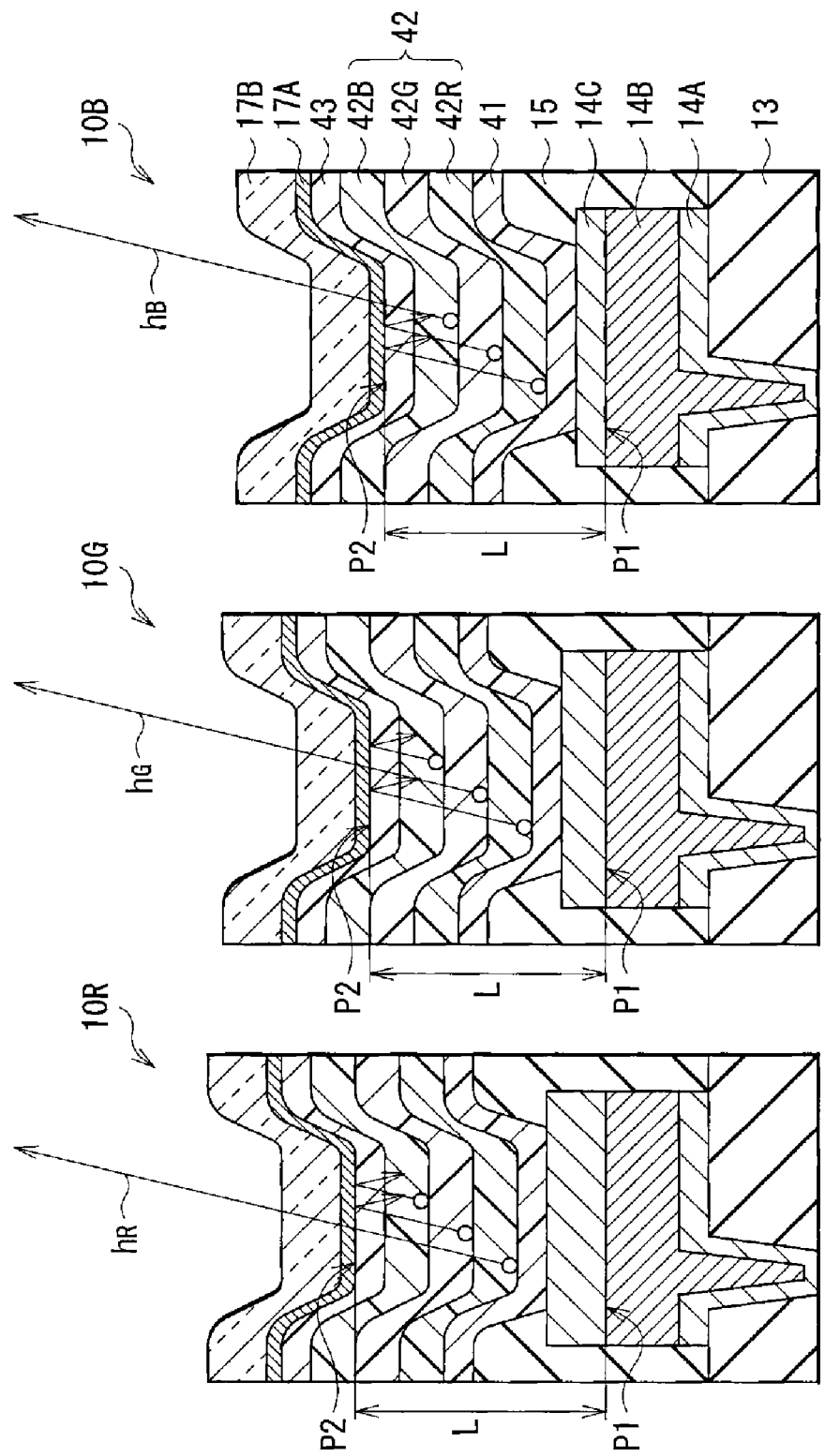
FIGS. 4A, 4B, and 4C are enlarged cross sectional views of organic light emitting devices shown in FIG. 3.

FIGS. 4A to 4C respectively show enlarged constructions of the organic light emitting devices 10R, 10G, and 10B. The first electrode 14 has preferably, for example, a laminated structure wherein a contact layer 14A, a reflective layer 14B, and a barrier layer 14C are layered in this order from the substrate 11 side. The contact layer 14A is intended to prevent the reflective layer 14B from separating from the planarizing layer 13. The reflective layer 14B is intended to reflect the light generated in the light emitting layer. The barrier layer 14C prevents silver or an alloy containing silver making the reflective layer 14B from reacting with oxygen in the air or sulfur component, and has a function as a protective film to reduce damage to the reflective layer 14B even in a manufacturing process after forming the reflective layer 14B.

The contact layer 14A has, for example, a thickness of 5 nm to 50 nm. In this embodiment, for example, the contact layer 14A has a thickness of 20 nm, and is made of a compound (ITO: Indium Tin Oxide) containing indium (In), tin (Sn), and oxygen (O). The reflective layer 14B has, for example, a thickness of 50 nm to 200 nm. In this embodiment, the reflective layer 14B has, for example, a thickness of 200 nm, and is made of silver (Ag) or an alloy containing silver in order to reduce light absorptance loss and improve reflectivity. The barrier layer 14C has, for example, a thickness of 1 nm to 50 nm, and is made of ITO. In this embodiment, a thickness of the barrier layer 14C varies according to light emitting colors of the organic light emitting devices 10R, 10G, and 10B, since an after-mentioned resonator structure is introduced to the organic light emitting devices 10R, 10G, and 10B.

The organic layer 16 has the same structure regardless of light emitting colors of the organic light emitting devices 10R, 10G, and 10B. For example, in the organic layer 16, an electron hole transport layer 41, a light emitting layer 42, and an electron transport layer 43 are layered in this order from the first electrode 14 side. The electron hole transport layer 41 is intended to improve efficiency to inject electron holes into the light emitting layer 42. In this embodiment, the electron hole transport layer 41 also has a function as an electron hole injection layer. The light emitting layer 42 is intended to generate light by recombination of electrons and electron holes caused by application of electric field. Light is emitted in a region corresponding to the aperture 15A of the insulating film 15. The electron transport layer 43 is intended to improve efficiency to inject electrons into the light emitting layer 42.

The electron hole transport layer 41 has, for example, a thickness of about 40 nm, and is made of 4,4',4"-tris(3-methylphenyl phenylamino) triphenylamine (m-MTDATA) or α-naphthyl phenyldiamine (αNPD).

The light emitting layer 42 is a light emitting layer for white light emitting. The light emitting layer 42 has, for example, a red light emitting layer 42R, a green light emitting layer 42G, and a blue light emitting layer 42B, which are layered on each other between the first electrode 14 and the second electrode 17. The red light emitting layer 42R, the green light emitting layer 42G, and the blue light emitting layer 42B are layered in this order from the anode, the first electrode 14 side. The red light emitting layer 42R generates red light by recombination of part of electron holes injected from the first electrode 14 through the electron hole transport layer 41 and part of electrons injected from the second electrode 17 through the electron transport layer 43, which is caused by application of electric field. The green light emitting layer 42G generates green light by recombination of part of electron holes injected from the first electrode 14 through the electron hole transport layer 41 and part of electrons injected from the second electrode 17 through the electron transport layer 43, which is caused by application of electric field. The blue light emitting layer 42B generates blue light by recombination of part of electron holes injected from the first electrode 14 through the electron hole transport layer 41 and part of electrons injected from the second electrode 17 through the electron transport layer 43, which is caused by application of electric field.

The red light emitting layer 42R contains, for example, at least one of a red light emitting material, an electron hole transport material, an electron transport material, and a both charge transport material. The red light emitting material can be fluorescent or phosphorescent. In this embodiment, the red light emitting layer 42R has, for example, a thickness of about 5 nm, and is made of a material wherein 30% by weight of 2,6-bis[(4'-methoxy diphenylamino)styryl]-1, 5-dicyano naphthalene (BSN) is mixed in 4,4'-bis(2,2'-diphenyl vinyl) biphenyl (DPVBi).

The green light emitting layer 42G contains at least one of a green light emitting material, an electron hole transport material, an electron transport material, and a both charge transport material. The green light emitting material can be fluorescent or phosphorescent. In this embodiment, the green light emitting layer 42G has, for example, a thickness of about 10 nm, and is made of a material wherein 5% by weight of coumarin 6 is mixed with DPVBi.

The blue light emitting layer 42B contains at least one of a blue light emitting material, an electron hole transport material, an electron transport material, and a both charge transport material. The blue light emitting material can be fluorescent or phosphorescent. In this embodiment, the blue light emitting layer 42B has, for example, a thickness of about 30 nm, and is made of a material wherein 2.5% by weight of 4,4'-bis[2-{4-(N,N-diphenylamino)phenyl}vinyl]biphenyl (DPAVBi) is mixed with DPVBi.

The electron transport layer 43 has, for example, a thickness of about 20 nm, and is made of 8-hydroxyquinoline aluminum ($Alq_3$).

The semi-transparent electrode 17A also has a function as a semi-transparent reflective layer which reflects the light generated in the light emitting layer 42 between the first electrode 14 and the reflective layer 14B. That is, the organic light emitting devices 10R, 10G, and 10B have a resonator structure wherein the light generated in the light emitting layer 42 is resonated and extracted from a second end P2 side, by setting an interface between the reflective layer 14B and the barrier layer 14C of the first electrode 14 to a first end P1, setting an interface of the semi-transparent electrode 17A on the light emitting layer 42 side to the second end P2, and setting the organic layer 16 and the barrier layer 14C to a resonance part.

It is preferable that the organic light emitting devices 10R, 10G, and 10B have such a resonator structure, since the light generated in the light emitting layer 42 generates multiple interference, and acts as a kind of narrow band filter, and therefore, a half value width of a spectrum of the light to be extracted is reduced and color purity can be improved. Further, as described above, it is preferable that a thickness of the barrier layer 14C is adjusted corresponding to light emitting colors of the organic light emitting devices 10R, 10G, and 10B to obtain different optical distances L between the first end P1 and the second end P2, since only light desired to be extracted among red light generated in the red light emitting layer 42R, green light generated in the green light emitting layer 42G, and blue light generated in the blue light emitting layer 42B can be resonated and extracted from the second end P2 side.

Further, it is preferable that the organic light emitting devices 10R, 10G, and 10B have such a resonator structure, since outside light entering from the sealing panel 20 can be attenuated by the multiple interference, and reflectance of outside light in the organic light emitting devices 10R, 10G, and 10B can be significantly reduced by combination with the color filter 22 shown in FIG. 3. That is, by corresponding the wavelength range having high transmittance in the color filter 22 with peak wavelength λ of the spectrum of light to be extracted from the resonator structure, only light having a wavelength equal to the peak wavelength λ of the spectrum of light to be extracted among the outside light entering from the sealing panel 20 passes through the color filter 22, and other outside light having other wavelengths is prevented from entering the organic light emitting devices 10R, 10G, and 10B.

To that end, it is preferable that the optical distance L between the first end P1 and the second end P2 of the resonator satisfies mathematical formula 1, and a resonance wavelength of the resonator (peak wavelength of a spectrum of light to be extracted) corresponds with a peak wavelength of a spectrum of light desired to be extracted. Actually, it is preferable that the optical distance L is selected to be a positive minimum value which satisfies the mathematical formula 1.

$$(2L)/\lambda + \Phi/(2\pi) = m \quad \text{(Mathematical formula 1)}$$

where L represents an optical distance between the first end P1 and the second end P2, Φ represents a sum ($\Phi=\Phi_1+\Phi_2$) (rad) of phase shift$\Phi_1$ of reflected light generated in the first end P1 and phase shift $\Phi_2$ of reflected light generated in the second end P2, λ represents a peak wavelength of a spectrum of light desired to be extracted from the second end P2 side, and m represents an integral number to make L positive, respectively. In the mathematical formula 1, units for L and λ should be common, for example, nm is used as a common unit.

This display unit can be manufactured, for example, as below.

FIGS. 5A and 5B to 12 show a method of manufacturing the display unit in order of processes. First, as shown in FIG. 5A, the TFT 12, the interlayer insulating film 12A, and the wiring 12B are formed on the substrate 11 made of the foregoing material.

Next, as shown in FIG. 5B, the planarizing layer 13 made of the foregoing material is formed on a whole surface of the substrate 11 by, for example, spin coat method. The planarizing layer 13 is patterned in a given shape by exposure and development, and the connecting hole 13A is formed.

Figure 6A:
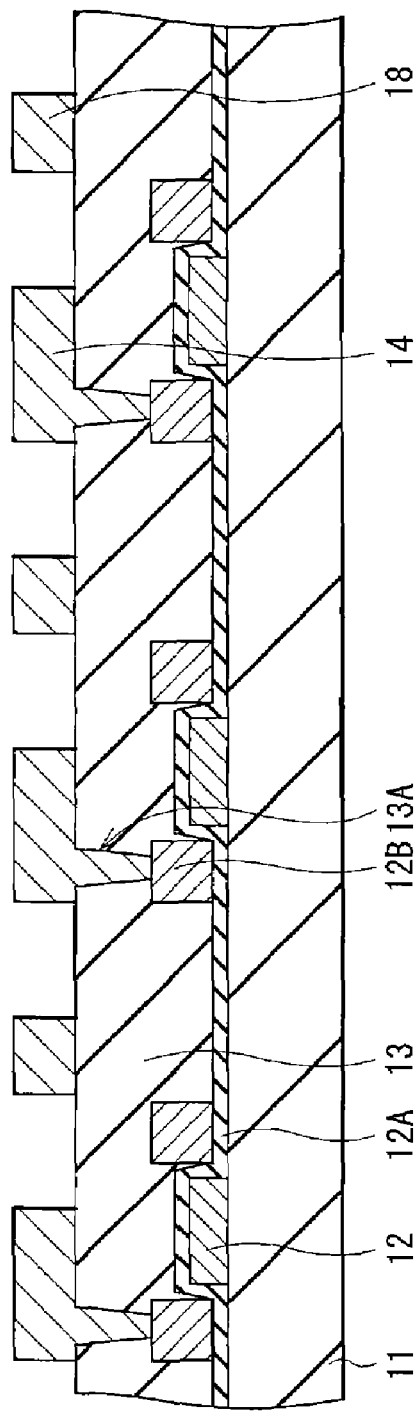
FIGS. 6A and 6B are cross sectional views showing processes following FIGS. 5A and 5B.

Subsequently, as shown in FIG. 6A, the first electrode 14 made of the foregoing material and having the foregoing thickness is formed on the planarizing layer 13. At this time, it is preferable that the auxiliary wiring 18 is formed in the same process as of the first electrode 14.

The first electrode 14 and the auxiliary wiring 18 can be formed, for example, by firstly forming the contact layer 14A, the reflective layer 14B, and the barrier layer 14C (refer to FIGS. 4A, 4B, and 4C) sequentially, and then etching the barrier layer 14C, the reflective layer 14B, and the contact layer 14A by using, for example, lithography technique. The contact layer 14A and the barrier layer 14C are formed by, for example, DC sputtering method, wherein mixed gas of argon (Ar) and oxygen ($O_2$) is used as sputtering gas, the pressure is, for example, 0.4 Pa, and the output is, for example, 300 W. The reflective layer 14B is formed by, for example, DC sputtering method, wherein argon (Ar) gas is used as sputtering gas, the pressure is, for example, 0.5 Pa, and the output is, for example, 300 W. When etching is performed, a thickness of the barrier layer 14C is varied according to light emitting colors of the organic light emitting devices 10R, 10G, and 10B.

Figure 6B:
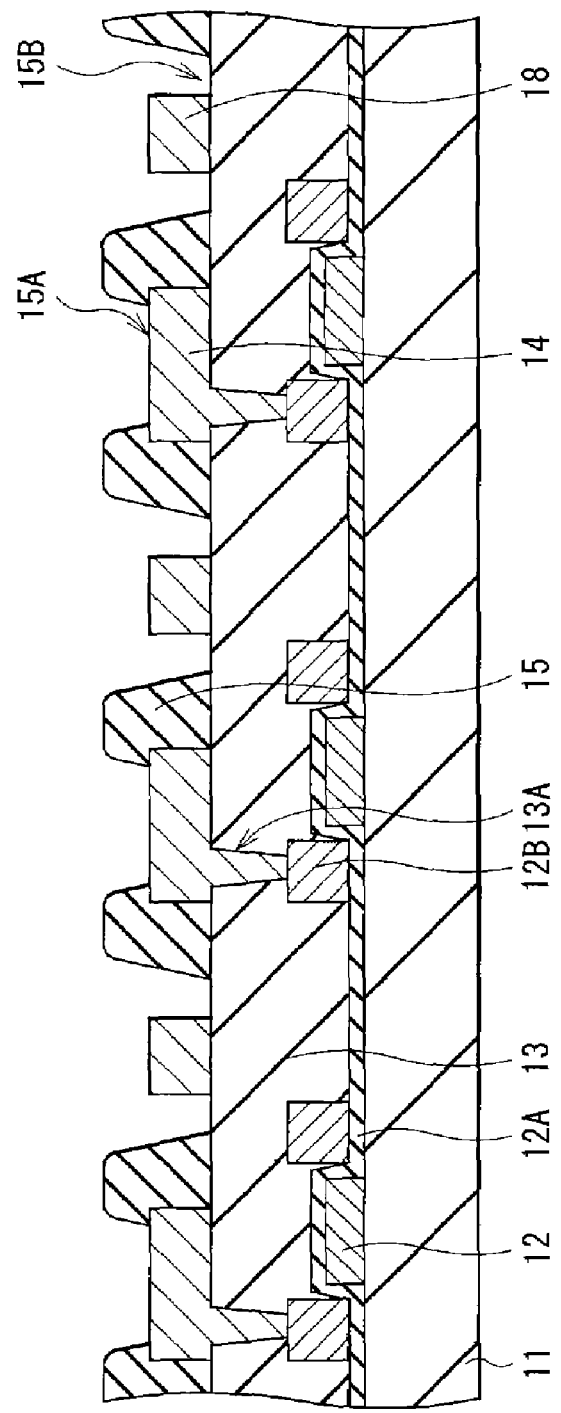

After that, as shown in FIG. 6B, the insulating film 15 with the foregoing thickness is deposited on a whole surface of the substrate 11 by, for example, CVD (Chemical Vapor Deposition) method. The apertures 15A and 15B are formed by selectively removing part of the insulating film 15 corresponding to the light emitting region and part of the insulating film 15 corresponding to the auxiliary wiring 18 by using, for example, lithography technique. Then, the aperture 15B is formed so that a side face of the auxiliary wiring 18 is exposed.

Figure 7:
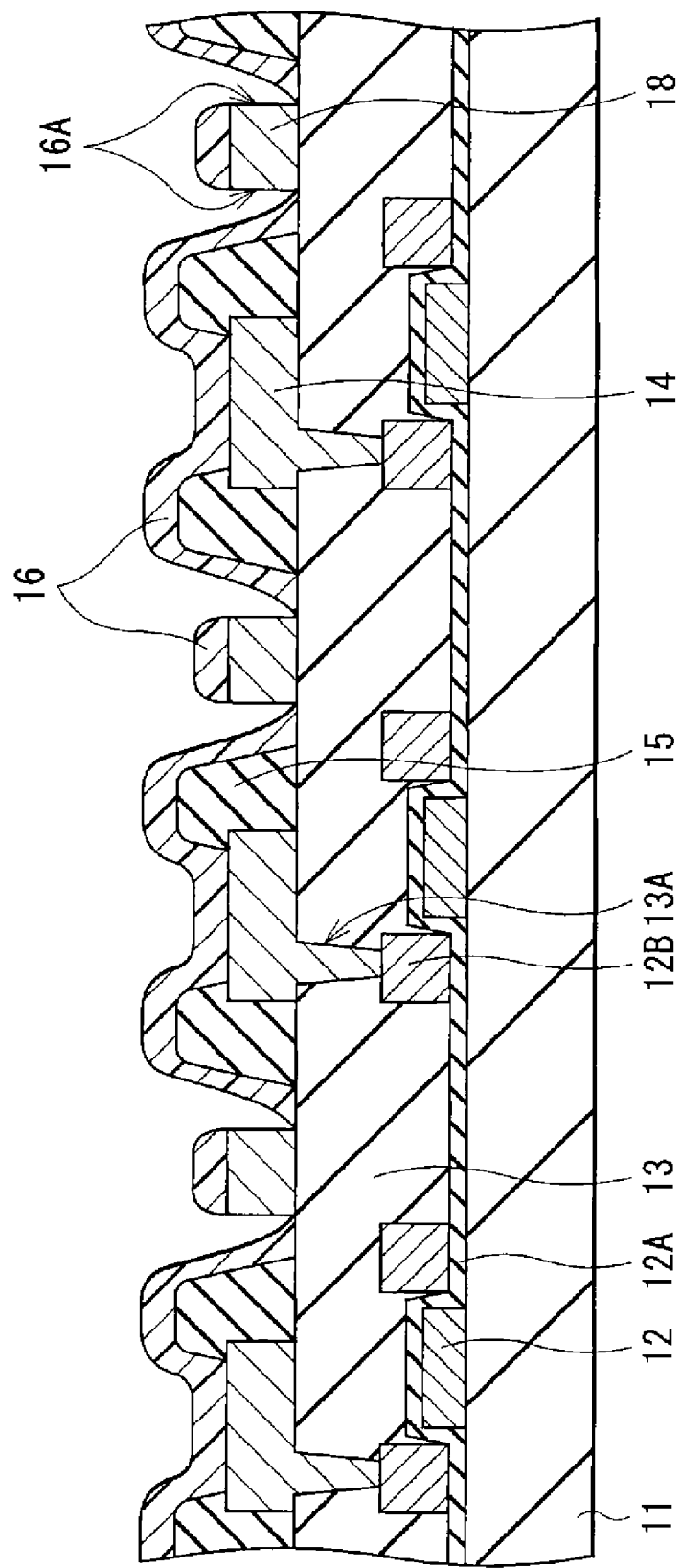
FIG. 7 is a cross sectional view showing a process following FIGS. 6A and 6B.
Figure 8:
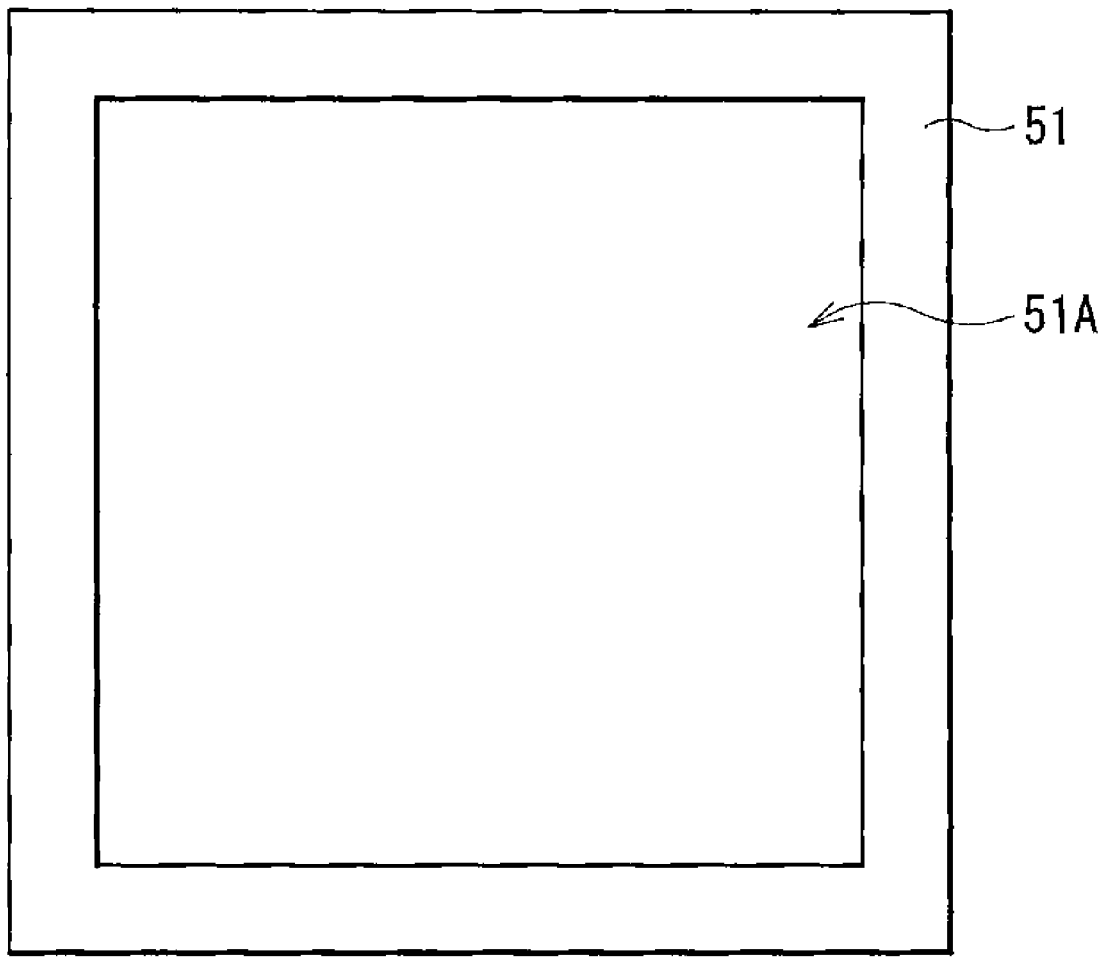
FIG. 8 is a cross sectional view showing a process following FIG. 7.

Next, as shown in FIG. 7, the organic layer 16 is formed by sequentially depositing the electron hole transport layer 41, the light emitting layer 42, and the electron transport layer 43 (refer to FIGS. 4A to 4C) made of the foregoing material and having the foregoing thickness on the first electrode 14, the insulating film 15, and the auxiliary wiring 18 by, for example, deposition method. Then, as shown in FIG. 8, the organic layer 16 is deposited on the whole surface of the substrate 11 except for a periphery of the substrate 11 and a part where an unshown extraction electrode is formed by using a metallic area mask 51 having an aperture 51A corresponding to an area to form the organic layer 16. In the result, though a top face of the auxiliary wiring 18 is covered with the organic layer 16, the organic layer 16 is broken by a step at the side face of the auxiliary wiring 18, and therefore, the break part 16A is formed.

Figure 9:
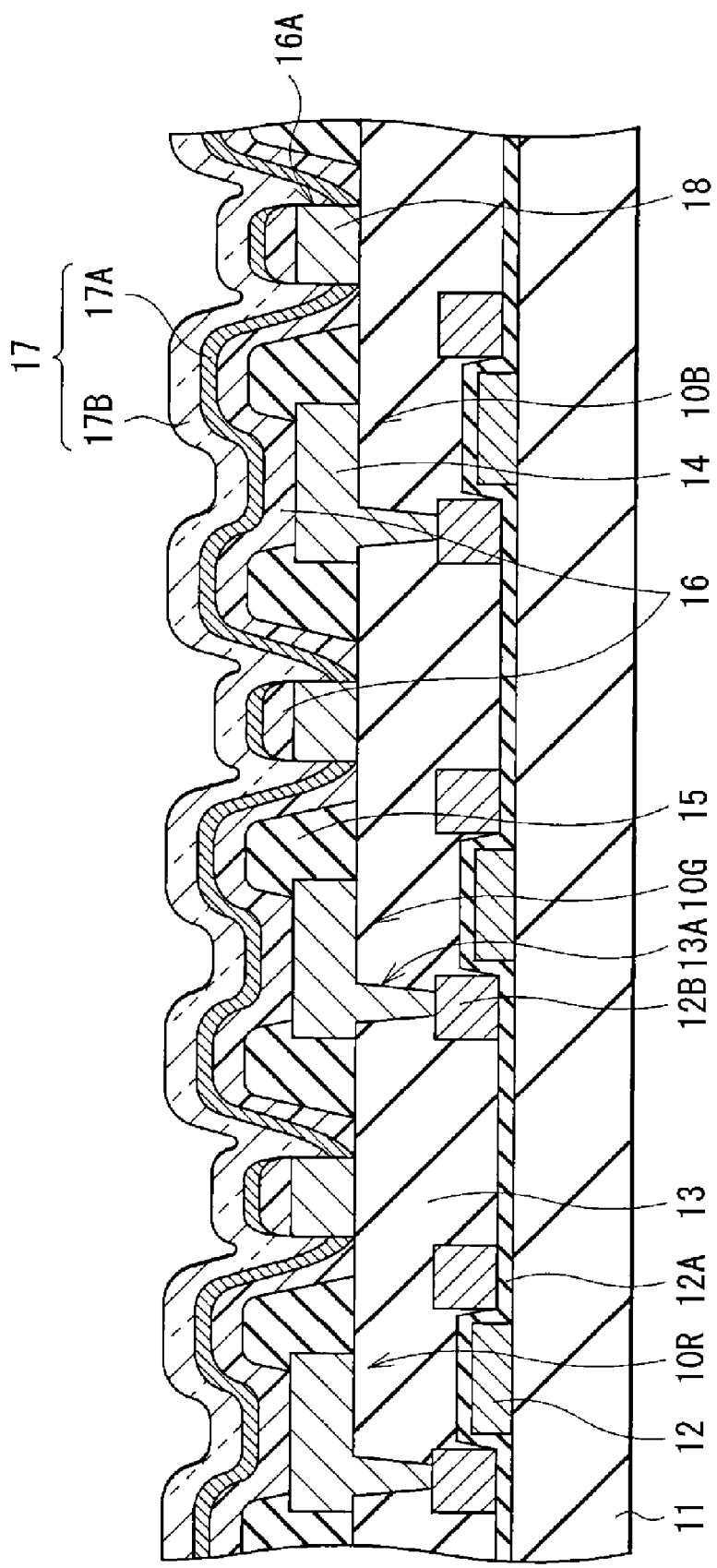
FIG. 9 is a cross sectional view showing a process following FIG. 8.

Subsequently, as shown in FIG. 9, the second electrode 17 is formed by sequentially forming the semi-transparent electrode 17A and the transparent electrode 17B made of the foregoing material and having the foregoing thickness on the organic layer 16. In the result, the second electrode 17 is electrically connected to the auxiliary wiring 18 at the break part 16A of the organic layer 16.

Specifically, first, the semi-transparent electrode 17A is formed by, for example, deposition method. That is, for example, regarding magnesium and silver making the semi-transparent electrode 17A, for example, 0.1 g of magnesium and 0.4 g of silver are filled in different boats for resistance heating respectively, and the boats are attached to a given electrode of an unshown vacuum deposition apparatus. Next, after atmosphere in the vacuum deposition apparatus is, for example, depressurized down to $1.0\times10^{-4}$ Pa, voltage is applied to the respective boats for resistance heating, the boats are heated, and magnesium and silver are deposited together. A ratio between growth rates of magnesium and silver is, for example, 9:1.

After that, the transparent electrode 17B is deposited on the semi-transparent electrode 17A. In the result, a contact area between the auxiliary wiring 18 and the second electrode 17 can be increased, and a contact resistance therebetween can be decreased. The transparent electrode 17B is preferably formed by sputtering method such as DC sputtering method. Since coating characteristics are high in the sputtering method compared to in vacuum deposition method, the transparent electrode 17B can be well formed on the side face of the auxiliary wiring 18. As sputtering gas, for example, mixed gas of argon and oxygen (volume ratio: $Ar:O_2=1,000:5$) is used. The pressure is, for example, 0.3 Pa, and the output is, for example, 400 W.

As above, the organic light emitting devices 10R, 10G, and 10B shown in FIGS. 3 to 4C are formed.

Figure 10:
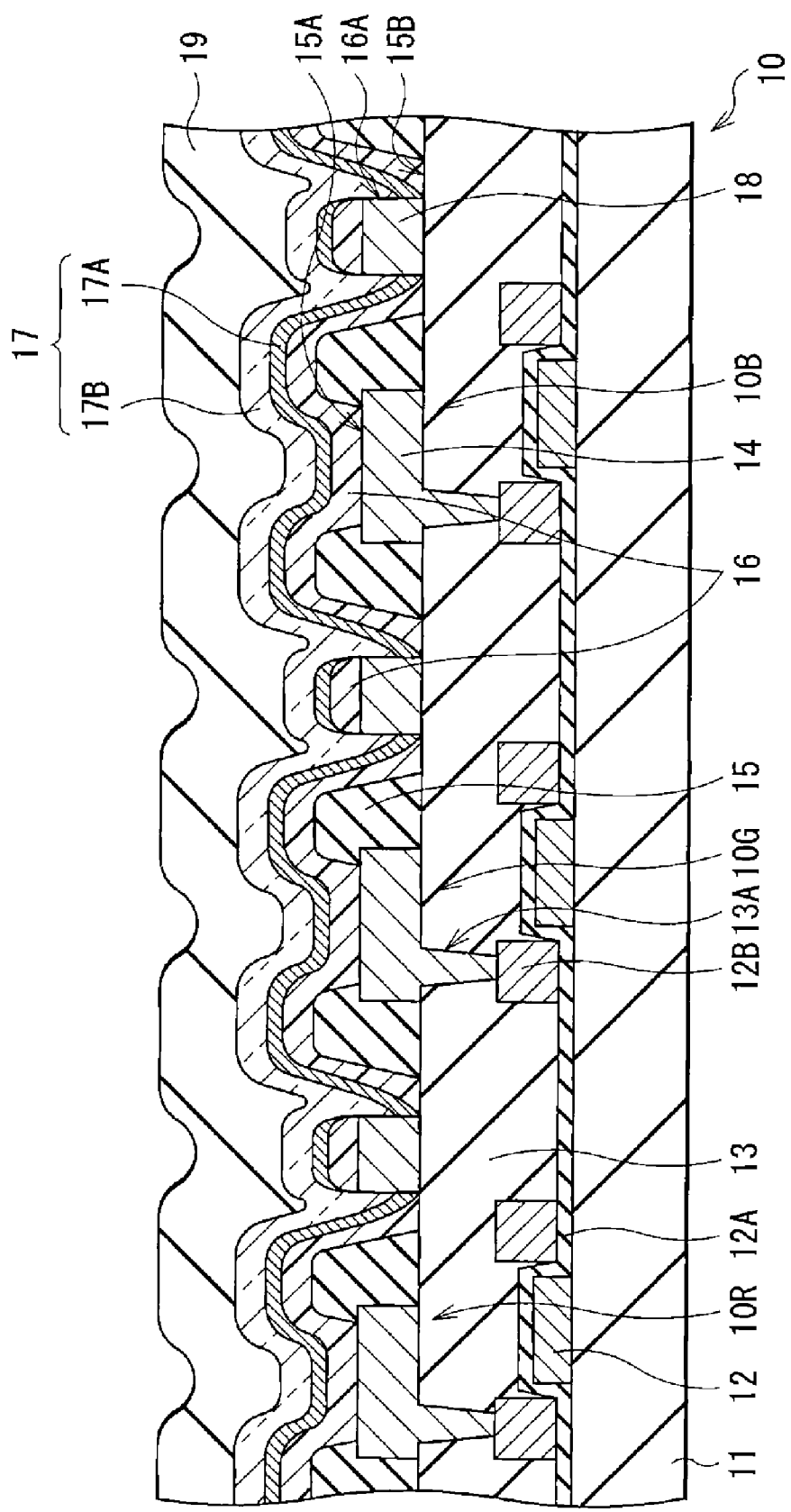
FIG. 10 is a cross sectional view showing a process following FIG. 9.

Next, as shown in FIG. 10, the protective film 19 made of the foregoing material and having the foregoing thickness is formed on the second electrode 17. The driving panel 10 shown in FIG. 3 is thereby formed.

Further, as shown in FIG. 11A, the red filter 22R is formed by, for example, coating a material for the red filter 22R on the sealing substrate 21 made of the foregoing material by spin coating or the like, and patterning by photolithography technique and firing. Subsequently, as shown in FIG. 11B, as in the red filter 22R, the blue filter 22B and the green filter 22G are sequentially formed. The sealing panel 20 is thereby formed.

Figure 12:
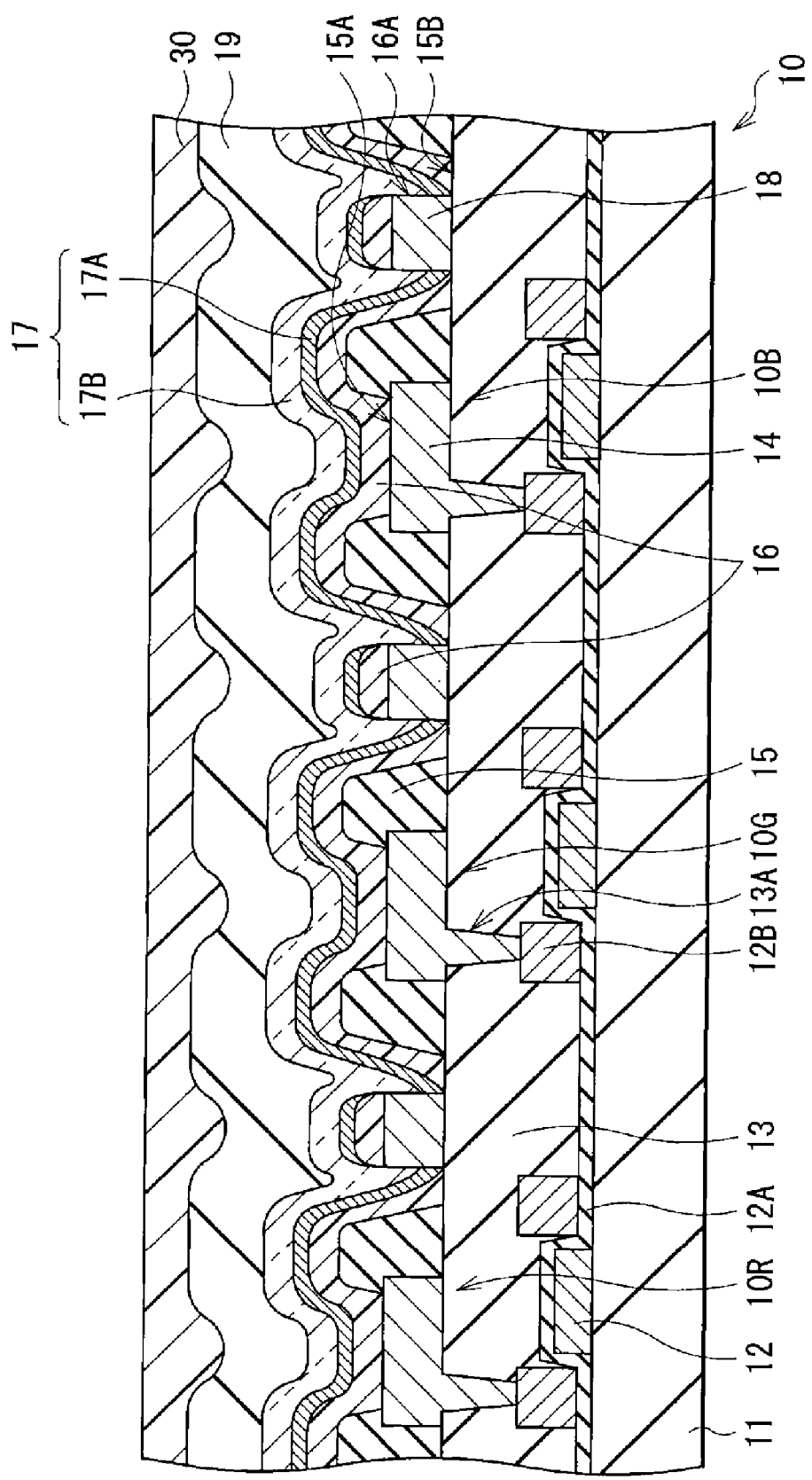
FIG. 12 is a cross sectional view showing a process following FIGS. 11A and 11B.

After forming the sealing panel 20 and the driving panel 10, as shown in FIG. 12, the adhesive layer 30 made of a thermosetting resin is coated on the side where the organic light emitting devices 10R, 10G, and 10B are formed of the substrate 11. Coating can be performed, for example, by discharging the resin from a slit nozzle dispenser, by roll coating or by screen printing. Next, as shown in FIG. 3, the driving panel 10 and the sealing panel 20 are bonded together with the adhesive layer 30 in between. Then, it is preferable that a side of the sealing panel 20 on which the color filter 22 is formed faces to the driving panel 10. Further, it is preferable to prevent air bubbles from mixing into the adhesive layer 30. After that, a relative positions of the color filter 22 of the sealing panel 20 and the organic light emitting devices 10R, 10G, and 10B of the driving panel 10 are aligned. Next, heat treatment is performed for given time at a given temperature, and the thermosetting resin of the adhesive layer 30 is cured. As above, the display unit shown in FIGS. 3 to 4C is completed.

In this display unit, for example, when a given voltage is applied between the first electrode 14 and the second electrode 17, a current is applied to the red light emitting layer 42R, the green light emitting layer 42G, and the blue light emitting layer 42B of the organic layer 16. Then, electron holes and electrons recombine with each other, and therefore, red light, green light, blue light are respectively generated in the red light emitting layer 42R, the green light emitting layer 42G, and the blue light emitting layer 42B. Regarding the red, green, and blue light, according to the optical distance L between the first end P1 and the second end P2 of the organic light emitting devices 10R, 10G, and 10B, only red light $h_R$ in the organic light emitting device 10R, only green light hG in the organic light emitting device 10G, and only blue light $h_B$ in the organic light emitting device 10B are multiple-reflected between the first end P1 and the second end P2, and then extracted through the second electrode 17. Here, the organic layer 16 has the break part 16A on the side face of the auxiliary wiring 18, and the auxiliary wiring 18 and the second electrode 17 are electrically connected through this break part 16A. Therefore, voltage drop in the second electrode 17 can be inhibited. Consequently, variation of luminance between a peripheral part and a central part of the display screen can be inhibited.

As above, in this embodiment, the organic layer 16 has the break part 16A on the side face of the auxiliary wiring 18, and the auxiliary wiring 18 and the second electrode 17 are electrically connected through this break part 16A. Therefore, voltage drop in the second electrode 17 can be inhibited by the auxiliary wiring 18, and variation of luminance in the screen can be inhibited. Consequently, its display quality can be improved.

Further, in this embodiment, first, the break part 16A is formed by breaking the organic layer 16 by the step of the side face of the auxiliary wiring 18, and then the second electrode 17 and the auxiliary wiring 18 are electrically connected through this break part 16A. Therefore, even when the organic layer 16 is formed without using the mask for pixel coating, the auxiliary wiring 18 and the second electrode 17 can be electrically connected. In the result, deposition failure such as lack of the organic layer 16 due to displacement or influence of thermal expansion of the mask for pixel coating can be prevented to improve process yield, which is significantly advantageous for making a high-definition display. Further, it is possible to prevent dust and the like adhering to the mask for pixel coating from adhering to the organic layer 16 and the like, which leads to a cause of short circuit. Furthermore, no extra process is needed to electrically connect the second electrode 17 and the auxiliary wiring 18. Therefore, the number of processes can be less.

Second Embodiment

Figure 13:
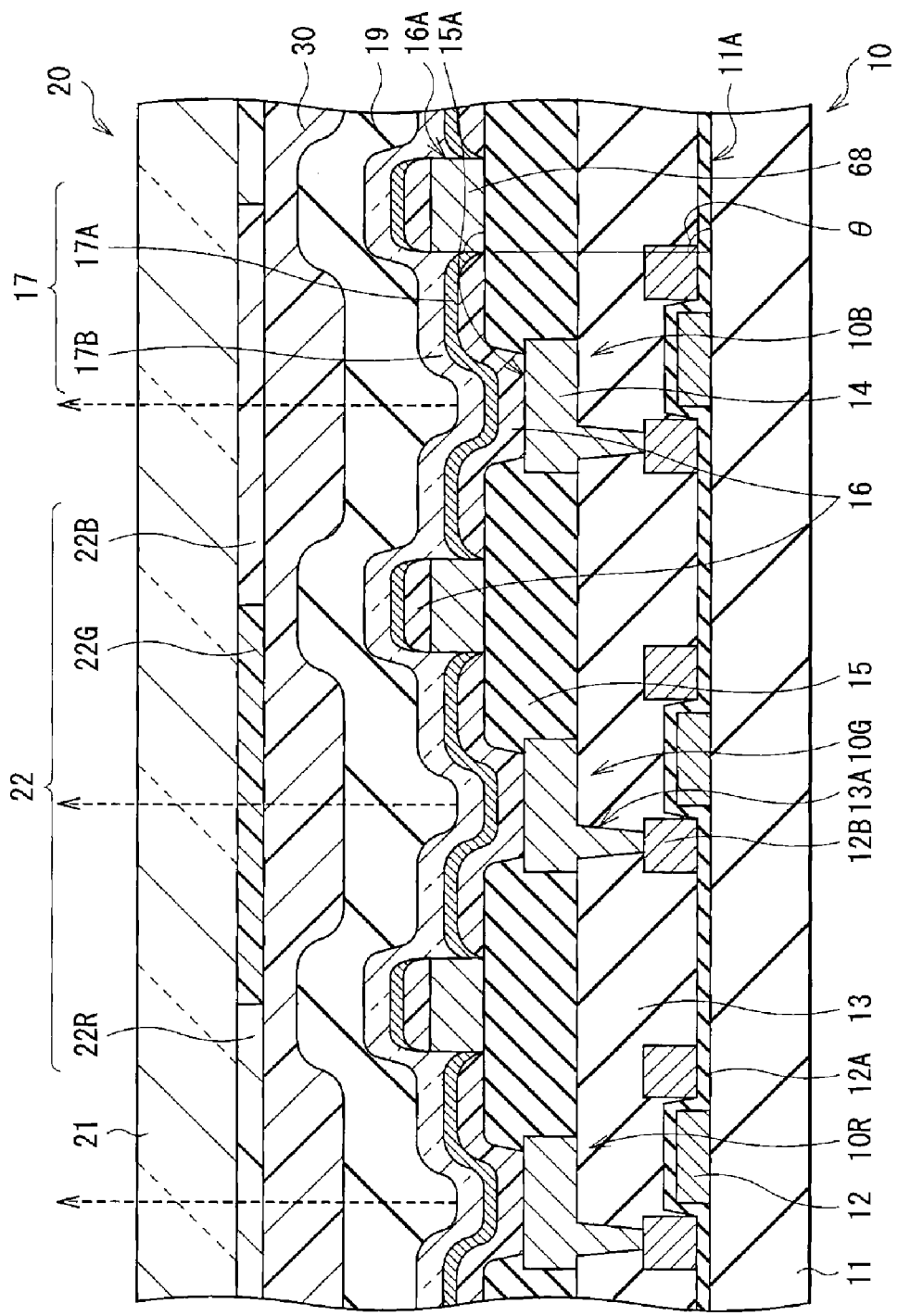
FIG. 13 is a cross sectional view showing a construction of a display unit according to a second embodiment of the invention.

FIG. 13 shows a cross sectional structure of a display unit according to a second embodiment. This display unit is the same as the display unit of the foregoing first embodiment except that an auxiliary wiring 68 is provided on the insulating film 15. Therefore, the same symbols are applied to the same components as of the first embodiment and explanation thereof will be omitted.

The auxiliary wiring 68 has a monolayer structure or a laminated structure of a low resistance conductive material such as aluminum (Al) and chromium (Cr). A width and a thickness of the auxiliary wiring 68 vary according to dimensions of a screen, materials and thicknesses of the second electrode and the like. In this embodiment, the auxiliary wiring 68 can have a different construction from that of the first electrode 14, and the construction of the auxiliary wiring 68 is not bound by a material or a thickness of the first electrode 14. Therefore, for example, it is possible to lower a sheet resistance of the second electrode 17 by making a thickness of the auxiliary wiring 68 larger than that of the first electrode 14.

This display unit can be, for example, manufactured as below.

First, as shown in FIGS. 6A to 6A in the first embodiment, the TFT 12, the planarizing layer 13, and the first electrode 14 are formed on the substrate 11 made of the foregoing material.

Figure 14A:
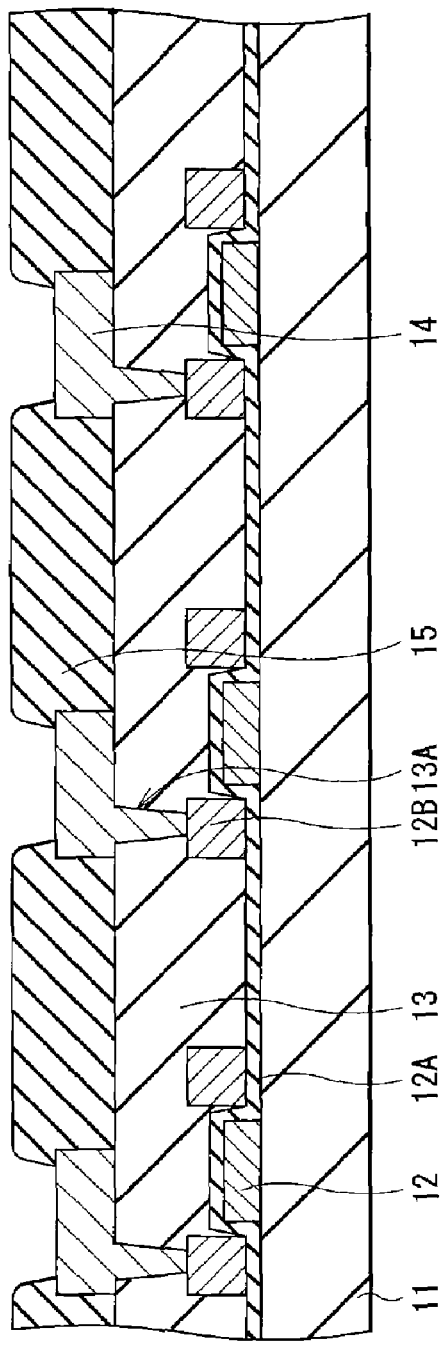
FIGS. 14A and 14B are cross sectional views showing a method of manufacturing the display unit shown in FIG. 13 in order of processes.

After that, as shown in FIG. 14A, the insulating film 15 with the foregoing thickness is deposited on a whole surface of the substrate 11 by, for example, CVD method. The aperture 15A is formed by selectively removing a part of the insulating film 15 corresponding to the light emitting region by using, for example, lithography technique.

Figure 14B:
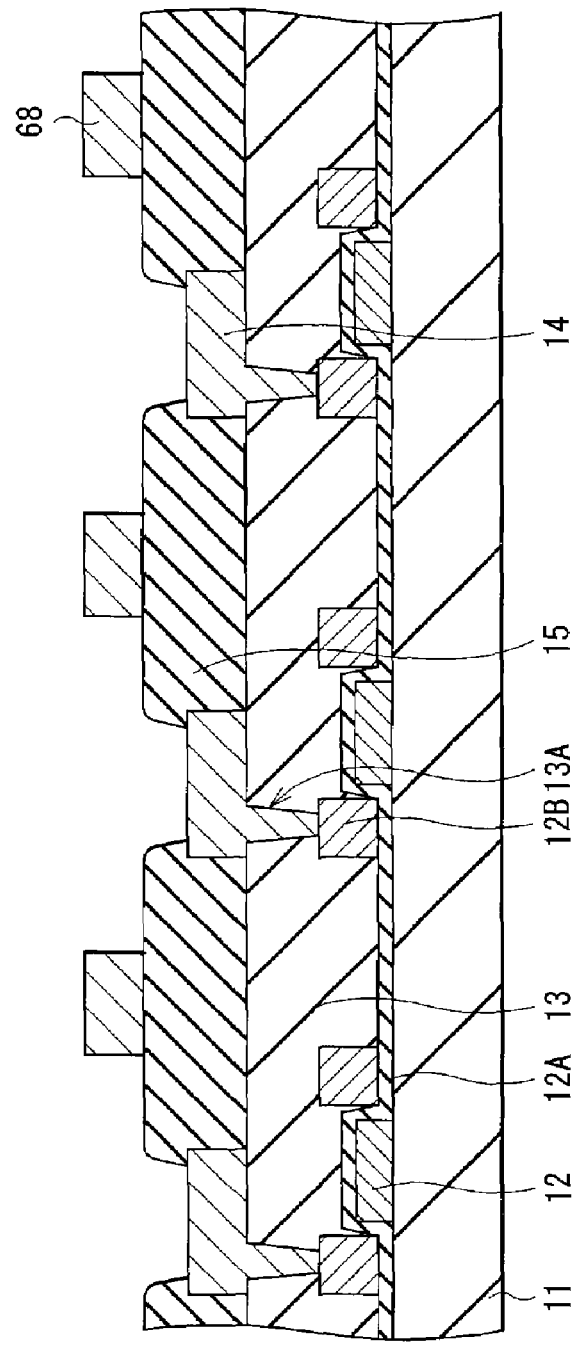

Subsequently, as shown in FIG. 14B, the auxiliary wiring 68 made of the foregoing material is formed on the insulating film 15.

After that, as shown in FIG. 15A, the organic layer 16 is formed on the first electrode 14, the insulating film 15, and the auxiliary wiring 68, and the break part 16A is formed on a side face of the auxiliary wiring 68 as in the first embodiment.

Subsequently, as shown in FIG. 15B, the semi-transparent electrode 17A and the transparent electrode 17B made of the foregoing material and having the foregoing thickness are formed on the organic layer 16 as in the first embodiment. The second electrode 17 is thereby electrically connected to the auxiliary wiring 68 at the break part 16A of the organic layer 16.

After that, as in the first embodiment, the protective film 19 made of the foregoing material and having the foregoing thickness is formed on the second electrode 17 to form the driving panel 10. This driving panel 10 and the sealing panel 20 are bonded together with the adhesive layer 30 in between. As above, the display unit shown in FIG. 13 is completed.

This display unit operates as in the first embodiment, and provides effects similar to that of the first embodiment.

While the invention has been described with reference to the embodiments, the invention is not limited to the foregoing embodiments, and various changes may be made. For example, in the foregoing embodiments, the case wherein the break parts 16A are formed on the both side faces of the auxiliary wiring 18 or 68 has been described. However, it is possible that the break part 16A is formed at least on part of the side faces of the auxiliary wiring 18 or 68. For example, it is possible to form the break part 16A on only one side face of the auxiliary wiring 18 or 68.

Figure 16:
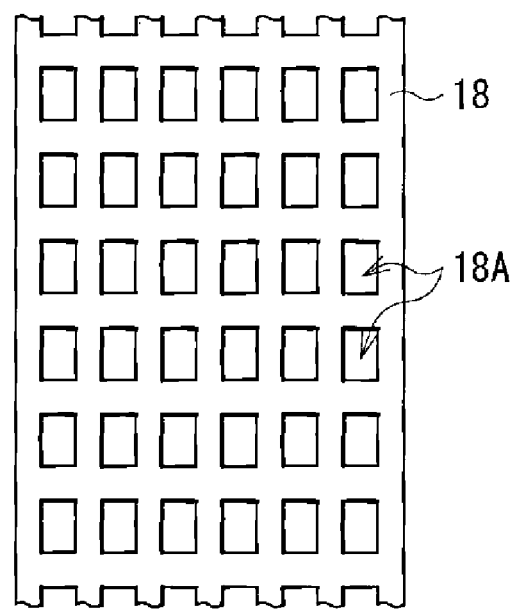
FIG. 16 is a plane view showing a modification of an auxiliary wiring shown in FIG. 3.
Figure 17:
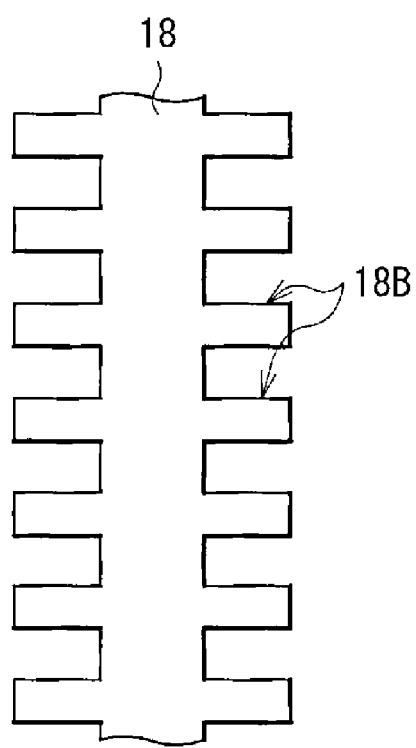
FIG. 17 is a plane view showing a modification of the auxiliary wiring shown in FIG. 3.

Further, for example, in the foregoing embodiments, the case wherein the auxiliary wiring 18 or 68 has a planar shape of a simple line segment has been described. However, the shape of the auxiliary wiring 18 or 68 is not particularly limited. For example, for the purpose of increasing a contact area with the second electrode 17 by increasing an area of the side face of the auxiliary wiring 18 or 68, an auxiliary wiring provided with holes 18A as shown in FIG. 16 or an auxiliary wiring provided with notches 18B on its side face as shown in FIG. 17A can be thought. A shape, the number, a position and the like of the hole 18A or the notch 18B are not particularly limited. In addition, the hole 18A and the notch 18B can be used at the same time.

Further, for example, in the first embodiment, the case wherein the aperture 15B of the insulating film 15 is formed so that the both side faces of the auxiliary wiring 18 are exposed has been described. However, it is possible that the aperture 15B of the insulating film 15 is formed so that at least part of the side faces of the auxiliary wiring 18 is exposed. For example, it is possible to form the aperture 15B so that only one side face of the auxiliary wiring 18 is exposed.

In addition, for example, materials, thicknesses, deposition methods, and deposition conditions of the respective layers, which have been described in the foregoing embodiments, are not limited to the above. Other materials, thicknesses, deposition methods, and deposition conditions can be applied. For example, materials for the contact layer 14A and the barrier layer 14C are not limited to the foregoing ITO and can be a metal compound or a conductive oxide containing at least one element from the group consisting of indium (In), tin (Sn), and zinc (Zn), more specifically, can be at least one from the group consisting of ITO, IZO, indium oxide ($In_2O_3$), tin oxide ($SnO_2$), and zinc oxide (ZnO). Further, a material for the contact layer 14A is not necessarily transparent.

Further, for example, in the foregoing embodiments, the constructions of the organic light emitting device and the display unit have been described with reference to the concrete examples. However, it is not necessary to provide all layers such as the protective film 19, and it is possible to further provide other layer. For example, it is possible that in the second electrode 17, the transparent electrode 17B is omitted, and only the semi-transparent electrode 17A is provided. Otherwise, it is possible that in the second electrode 17, the semi-transparent electrode 17A is omitted, and only the transparent electrode 17B is provided. In the case that the second electrode 17 is composed of only the transparent electrode 17B as above, it is possible that a thickness of the barrier layer 14C is the same for the organic light emitting devices 10R, 10G, and 10B, and the foregoing resonator structure is omitted.

In addition, in the foregoing embodiments, the case wherein in the first electrode 14, the contact layer 14A, the reflective layer 14B, and the barrier layer 14C are formed in this order from the substrate 11 side has been described. However, one or both of the contact layer 14A and the barrier layer 14C can be omitted.

Further, in the foregoing embodiments, the case wherein the light emitting layer for white light emitting is formed as the light emitting layer 42 of the organic layer 16, and color display is performed by using the foregoing resonator structure and the color filter 22 has been described. However, it is possible to perform the color display by using only the color filter 22 without using the resonator structure. Further, it is possible to perform the color display by using an optical filter or the like to let through only light having specific wavelengths, instead of the color filter 22.

Further, in the foregoing embodiments, the case wherein the light emitting layer for white light emitting containing three layers of the red light emitting layer 42R, the green light emitting layer 42G, and the blue light emitting layer 42B is formed as the light emitting layer 42 of the organic layer 16 has been described. However, a construction of the light emitting layer 42 for white light emitting is not particularly limited, and can be a laminated structure of light emitting layers of two colors in relation of complimentary colors to each other, such as an orange light emitting layer and a blue light emitting layer, and a blue-green light emitting layer and a red light emitting layer.

Further, it is not always necessary that the light emitting layer 42 of the organic layer 16 is the light emitting layer for white light emitting. The invention can be applied to a color changing type full-color display unit, wherein the green light emitting and the red light emitting are obtained from the blue light emitting layer other than the blue light emitting through a color changing layer, and to a mono-color display unit, wherein, for example, only the green light emitting layer 42G is formed.

Further, in the foregoing embodiments, the case wherein the organic light emitting devices 10R, 10G, and 10B are sealed by bonding the driving panel 10 and the sealing panel 20 with the adhesive layer 30 in between has been described. However, a sealing method is not particularly limited. For example, sealing can be performed by arranging a sealing can on a rear face of the driving panel 10.

Further, in the foregoing embodiments, the case wherein the first electrode 14 is an anode and the second electrode 17 is a cathode has been described. However, it is possible to reverse the anode and the cathode, that is, the first electrode 14 can be a cathode and the second electrode 17 can be an anode. In this case, as a material for the second electrode 17, a simple substance or an alloy of gold, silver, platinum, copper or the like is suitable. However, other material can be used by providing a layer similar to the barrier layer 14C in the foregoing embodiments on the surface of the second electrode 17. Further, when the first electrode 14 is a cathode and the second electrode 17 is an anode, it is preferable that in the light emitting layer 42, the red light emitting layer 42R, the green light emitting layer 42G, and the blue light emitting layer 42B are layered in this order from the second electrode 17 side.

Further, in the foregoing embodiments, the case wherein the sealing substrate 21 is provided with the color filter 22 has been described. However, it is possible to provide a reflected light absorption film as a black matrix along interfaces between the red filter 22R, the green filter 22G, and the blue filter 22B as necessary. The reflected light absorption film can be made of a black resin film mixed with black colorant having optical density of one or more, or a thin film filter utilizing interference of the thin films. The black resin film is preferably used, since the black resin film can be formed inexpensively and easily. The thin film filter has, for example, a laminated structure of one or more thin film layers made of metal, a metallic nitride, or a metallic oxide. The thin film filter attenuates light by utilizing interference of the thin films. Concrete examples of the thin film filter include a lamination wherein chromium and chromium oxide (III) ($Cr_2O_3$) are alternately layered.

Obviously many modifications and variations of the present invention are possible in the light of the above teachings. It is therefore to be understood that within the scope of the appended claims the invention may be practiced otherwise than as specifically described.

What is claimed is:

1. A method of manufacturing an organic light emitting device comprising the steps of:
    forming a first electrode and an auxiliary wiring insulated from the first electrode on a substrate at the same time;
    forming an insulating film on a whole surface of the substrate after forming the first electrode and the auxiliary wiring;
    forming a first aperture corresponding to a light emitting region and a second aperture corresponding to the auxiliary wiring by selectively removing the insulating film covering the auxiliary wiring and the light emitting region;

forming an organic layer including a light emitting layer on at least the first electrode and the auxiliary wiring, and forming a break part by covering only the top surface of the auxiliary wiring facing away from the substrate with the organic layer and leaving the side facing the auxiliary wiring exposed; and forming a second electrode on the organic layer, and electrically connecting the second electrode and the auxiliary wiring at the break part of the organic layer.

2. A method of manufacturing an organic light emitting device according to claim 1, wherein a process to form an insulating film so that at least part of the side faces of the auxiliary wiring is exposed is included, after the process to form the first electrode and the auxiliary wiring.

3. A method of manufacturing an organic light emitting device according to claim 1, wherein a laminated structure of a plurality of layers including a transparent electrode is formed as the second electrode.

4. A method of manufacturing an organic light emitting device according to claim 3, wherein the transparent electrode is formed by sputtering.

5. A method of manufacturing an organic light emitting device according to claim 3, wherein the transparent electrode is made of at least one of an indium oxide (InOx), a tin oxide (SnOx), and zinc oxide (ZnOx).

6. A method of manufacturing an organic light emitting device according to claim 1, wherein the auxiliary wiring is made of the same material as of the first electrode.

7. A method of manufacturing an organic light emitting device according to claim 1, wherein a thickness of the first electrode is between 100 nm and 300 nm.

8. A method of manufacturing an organic light emitting device according to claim 1, wherein the first electrode and the auxiliary wiring are formed by firstly forming a contact layer, a reflective layer, and a barrier layer sequentially, and then etching the barrier layer, the reflective layer and the contact layer.

9. A method of manufacturing an organic light emitting device according to claim 8, wherein the etching is performed so that a thickness of the baffler layer is varied according to light emitting colors of organic light emitting devices.

10. A method of manufacturing an organic light emitting device according to claim 1, wherein a thickness of the auxilliary wiring is larger than a thickness of the organic layer.

* * * * *